(12) United States Patent
Tseng

(10) Patent No.: US 6,294,434 B1
(45) Date of Patent: Sep. 25, 2001

(54) METHOD OF FORMING A METAL SILICIDE LAYER ON A POLYSILICON GATE STRUCTURE AND ON A SOURCE/DRAIN REGION OF A MOSFET DEVICE

(75) Inventor: Horng-Huei Tseng, Hsin-Chu (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

(21) Appl. No.: 09/670,379

(22) Filed: Sep. 27, 2000

(51) Int. Cl.$^7$ .................................................. H01L 21/336
(52) U.S. Cl. ....................... 438/303; 438/533; 438/586; 438/664
(58) Field of Search ................................. 438/301, 303, 438/523, 533, 586, 592, 664

(56) References Cited

U.S. PATENT DOCUMENTS

| 5,563,100 | * | 10/1996 | Matsubara | 438/303 |
| 5,858,846 | * | 1/1999 | Tsai et al. | 438/303 |
| 5,918,141 | * | 6/1999 | Merrill | 438/583 |
| 6,087,700 |  | 7/2000 | Fazan et al. | 257/413 |

FOREIGN PATENT DOCUMENTS

0455284-A1 * 11/1991 (EP) ............................. H01L/21/285

* cited by examiner

*Primary Examiner*—T. N. Quach
(74) *Attorney, Agent, or Firm*—George O. Saile; Stephen B. Ackerman

(57) ABSTRACT

A process of forming a metal silicide layer, for a salicide gate structure, and forming a metal silicide layer for a MOSFET source/drain region, featuring ion implanted metal ions providing the metal component of the metal silicide layers, has been developed. After formation of a polysilicon gate structure, and of a heavily doped source/drain region, metal ions are implanted into a top portion of both the heavily doped source/drain region, and polysilicon gate structure. The metal ions are chosen from a group that includes titanium, tantalum, platinum, palladium, nickel and cobalt ions. A first anneal procedure is then employed resulting in the formation of the metal silicide layer on the heavily doped source/drain region, and formation of a salicide gate structure, comprised of metal silicide on the polysilicon gate structure. Selective removal of unreacted metal ions is then accomplished using wet etchant solutions, followed by a second anneal procedure, used to reduce the resistance of the metal silicide layers. The use of implanted metal ions, when compared to a blanket deposited metal layer, reduces the risk of unremoved metal, or formation of metal silicide ribbons, located on the surface of insulator, at the conclusion of the selective removal procedure, resulting in gate to substrate leakage or shorts.

19 Claims, 2 Drawing Sheets

METHOD OF FORMING A METAL SILICIDE LAYER ON A POLYSILICON GATE STRUCTURE AND ON A SOURCE/DRAIN REGION OF A MOSFET DEVICE

BACKGROUND OF THE INVENTION (1) Field of the Invention

The present invention relates to methods used to fabricate semiconductor devices, and more specifically to a method used to form a metal silicide layer on a polysilicon gate structure, as well as on a source/drain region of a metal oxide semiconductor field effect transistor, (MOSFET), device.

(2) Description of Prior Art

Increased device performance is a major objective of the semiconductor industry. The ability to decrease resistance-capacitance (RC), delays allows the desired performance increases to be realized. The advent of micro-miniaturization, or the ability to fabricate semiconductor devices with sub-micron features, have resulted in decreased junction capacitance, thus increased device performance as a result of the use of smaller dimension diffused regions. In addition the resistance component of the RC delay factor has in part been addressed via resistance decreases in word line and bit line resistance, via the use of metal silicide layers formed on both gate structures as well as on source/drain regions. One method of forming metal silicide layers on these regions has been the use of a Self-ALIgned metal siliCIDE, (salicide), procedure, in which a blanket metal is deposited, annealed to form the desired metal silicide layer on regions in which the metal layer overlaid silicon, (top surface of gate structure and source/drain region), followed by the removal of unreacted metal from insulator surfaces, such as insulator spacers located on the sides of the gate structure. However one problem encountered with the salicide procedure is the inability to completely remove unreacted metal from the insulator spacers, resulting in gate to substrate leakage or shorts. In addition prolonged anneal cycles, used to insure salicide reaction can result in the formation of metal silicide ribbons on the surface of the insulator spacers, extending from the gate structure to source/drain regions, again resulting in yield loss in terms of gate to substrate leakage or shorts.

The present invention will describe a procedure for forming metal silicide on a polysilicon gate structure, as well as on a source/drain region, however using implantation of metal ions only into the top surface of the polysilicon gate structure and into the top surface of a source/drain region. This feature, selectively placing metal only in regions in which the metal silicide layer is desired, eliminates the risk of forming ribbons, or leaving unreacted metal, on the sides of the insulator spacers, sometimes encountered with the salicide procedure employing vacuum deposition of a blanket metal layer, used for subsequent salicide formation. Prior art, such as Fazan et al, in U.S. Pat. No. 6,087,700, describe a method of forming a metal silicide layer on a blanket polysilicon layer, prior to defining the metal silicide-polysilicon gate structure. That prior art however does not describe this present invention in which metal silicide is formed on the top surface of a defined polysilicon gate structure, and on a source/drain region, via implantation of metal ions.

SUMMARY OF THE INVENTION

It is an object of this invention to form a metal silicide layer only on a polysilicon gate structure and on a source/drain region of a MOSFET device.

It is another object of this invention to implant metal ions into a top portion of a defined polysilicon gate structure, and into a top portion of a source/drain region of a MOSFET device.

It is yet another object of this invention to perform an anneal cycle to form metal silicide on the source/drain region, and to form a metal silicide layer on the defined polysilicon structure, via reaction of the implanted metal ions and silicon, available from the polysilicon gate structure and from the source/drain region.

It is still yet another object of this invention to selectively remove unreacted metal ions from the surface of the metal silicide layer.

In accordance with the present invention a method of forming a metal silicide layer for a salicide gate structure, and forming a metal silicide layer on a source/drain region of a MOSFET device, featuring a metal implantation procedure used to supply the metal component of the metal silicide layer, is described. A polysilicon gate structure is formed on the an underlying silicon dioxide gate insulator layer, followed by formation of insulator spacers on the sides of the polysilicon gate structure. A heavily doped source/drain region is formed in a region of the semiconductor substrate not covered by the polysilicon gate structure or by the insulator spacers. Metal ions are next implanted into a top portion of the defined polysilicon gate structure, as well as into a top portion of the heavily doped source/drain region. A first anneal procedure is then used to form the desired metal silicide layer on the top surface of the heavily doped source/drain region, as well as on the top surface of the polysilicon gate structure, creating a salicide gate structure. Unreacted metal ions are then selectively removed from the top surface of the metal silicide layers. An optional second anneal cycle can next be performed to create a lower resistance phase of the metal silicide layers.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
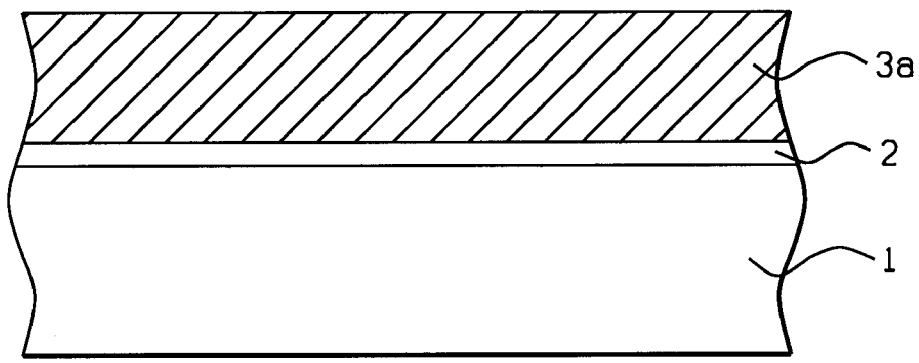
FIGS. 1–5, which schematically, in cross-sectional style, describe key stages of fabrication used to form a metal silicide layer, for a component of a salicide gate structure, and used to form a metal silicide layer on a source/drain region of a MOSFET device, featuring a metal implantation procedure used to supply the metal component of the metal silicide layer, is described.
Figure 2:
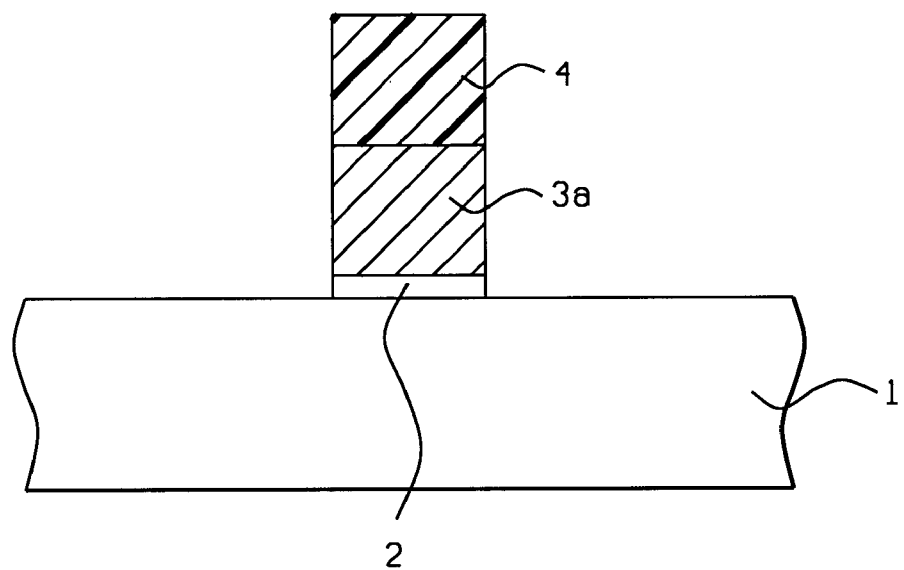

The method of forming a metal silicide layer as a component of a MOSFET salicide gate structure, and of simultaneously forming a metal silicide layer on a MOSFET source/drain region, featuring a metal implantation procedure used to supply the metal component of the metal silicide layer, will now be described in detail. A P type, semiconductor substrate 1, comprised with single crystalline silicon, with a <100> crystallographic orientation, is used and schematically shown in FIG. 1. A silicon dioxide, gate insulator layer 2, is thermally grown to a thickness between about 50 to 300 Angstroms, in an oxygen-steam ambient, at a temperature between about 800 to 1200° C. A polysilicon layer 3a, is next deposited via low pressure chemical vapor deposition, (LPCVD), procedures, to a thickness between about 500 to 3500 Angstroms. Polysilicon layer 3a, can be doped in situ, during deposition, via the addition of arsine, or phosphine, to a silane ambient, or polysilicon layer 3a, can be deposited intrinsically then doped via implantation of arsenic or phosphorous ions. The results of these procedures are schematically shown in FIG. 1. Photoresist shape 4, is next formed and used as an etch mask to allow an anisotropic, reactive ion etch (RIE), procedure to define polysilicon gate structure 3b, schematically shown in FIG. 2. The RIE procedure is performed using $SF_6$ or $Cl_2$ as an etchant for polysilicon layer 3a. Removal of the photoresist shape 4, used as a mask for definition of polysilicon gate structure 3b, is accomplished via plasma oxygen ashing and careful wet cleans, with a buffered hydrofluoric component of the wet cleans, removing the portion of silicon dioxide gate insulator layer 2, not covered by polysilicon gate structure.

Figure 3:
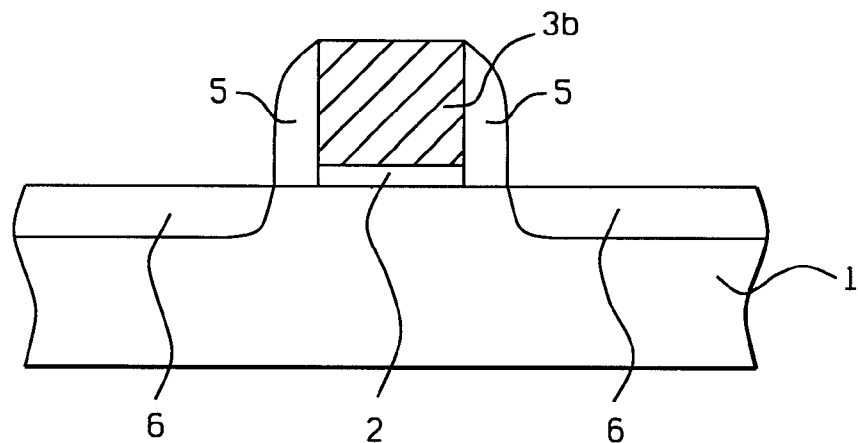

Insulator spacers 5, are next formed on the sides of polysilicon gate structure 3b. This is accomplished by deposition of an insulator layer such as silicon oxide, or silicon nitride, at a thickness between about 500 to 3000 Angstroms, using either LPCVD or PECVD procedures. An anisotropic RIE procedure, using either $CF_4$ or $CHF_3$ as an etchant, is used to create insulator spacers 5, located on the sides of polysilicon gate structure 3b. Heavily doped source/drain region 6, is next formed in regions of semiconductor substrate 1, not covered by polysilicon gate structure 3b, or by insulator spacers 5, via implantation of arsenic or phosphorous ions, at an energy between about 30 to 70 KeV, and at a dose between about 1E14 to 1E15 atoms/cm$^2$. The results of these procedures is schematically shown in FIG. 3. Although this invention is shown as applied to an N channel, MOSFET device, it can also be applied to a P channel, MOSFET device, by formation of an N well region in the semiconductor substrate, and the formation of P type heavily doped source/drain regions, in the N well region of the P channel, MOSFET device.

Figure 4:
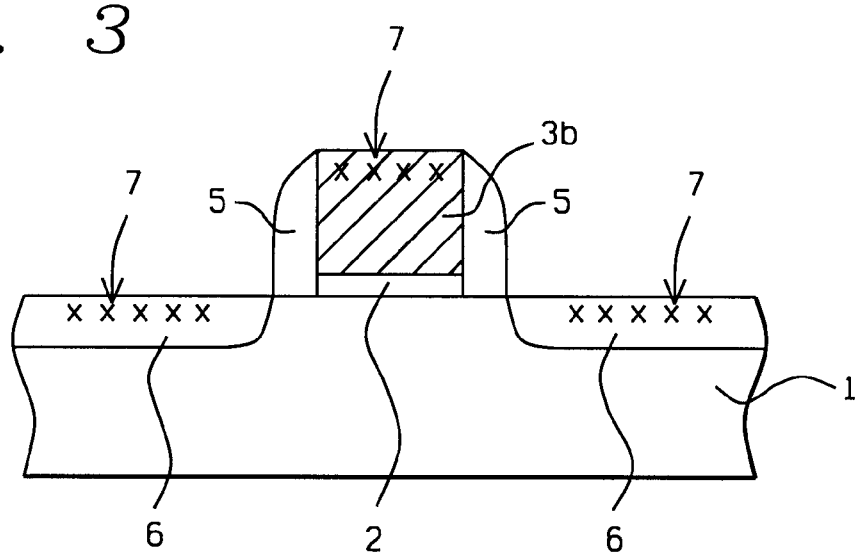
Figure 5:
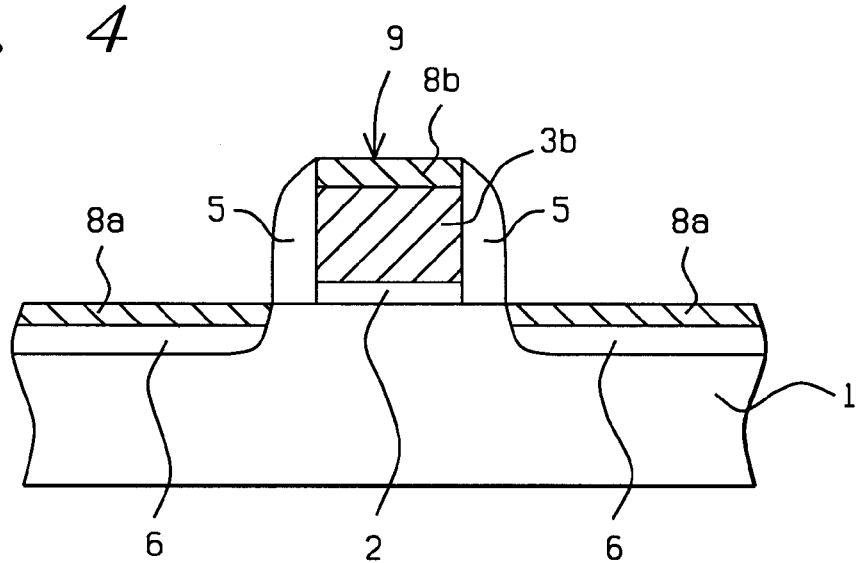

The method of forming metal silicide on polysilicon gate structure 3b, as well as on heavily doped source/drain region 6, via implantation of metal ions, is next addressed and schematically shown in FIGS. 4–5. A blanket ion implantation procedure is performed placing metal ions 7, into a top portion of heavily doped source/drain region 6, as well as into a top portion of polysilicon gate structure 3b. This is schematically shown in FIG. 4. Metal ions 7, can be chosen from a group that includes titanium, tantalum, platinum, palladium, cobalt and nickel. The implantation procedure is performed at an implant angle between about 0 to 20 degrees.

A first anneal procedure is next employed to allow reaction of metal ions 7, and silicon located in top portion of heavily doped source/drain region 6, resulting in the selective formation of metal silicide layer 8a, at a thickness between about 30 to 1000 Angstroms, on heavily doped source/drain region 6. The same first anneal procedure also results in formation of metal silicide layer 8b, at a thickness between about 30 to 1000 Angstroms, on polysilicon gate structure 3b, resulting in salicide gate structure 9, schematically shown in FIG. 5, comprised of metal silicide layer 8b, on polysilicon gate structure 3b. The conditions used for the first anneal cycle are dependent on the metal ion used, and can be performed using conventional furnace procedures, or using rapid thermal anneal (RTA), procedures, in a nitrogen ambient. Selective removal of any unreacted metal ions, still remaining on the top surface of the metal silicide layers is next performed using a solution comprised of $H_2O_2$—$NH_4OH$—$H_2O$, at a temperature between about 60 to 100° C. If lower source/drain resistance is desired a second anneal procedure, such as an RTA procedure can be performed to convert metal silicide layer 8a, on heavily doped source/drain region 6, and metal silicide layer 8b, located on polysilicon gate structure 3b, to a lower resistance, metal silicide phase. This procedure of using metal implantation as a component of the metal silicide formation reduces the risk of substrate, (source/drain), to gate shorts, sometimes encountered using a procedure in which the metal layer is blanket deposited, with subsequent unreacted metal, or metal silicide ribbons, having to be removed from the insulator spacer to prevent substrate to gate leakage or shorts.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal oxide semiconductor field effect transistor (MOSFET), device on a semiconductor substrate, comprising the steps of:

forming a gate insulator layer on said semiconductor substrate;

forming a gate structure on said gate insulator layer;

forming insulator spacers on the sides of said gate structure;

forming a heavily doped source/drain region in an area of said semiconductor substrate not covered by said gate structure or by said insulator spacers;

performing a blanket ion implantation procedure to place metal ions into a top portion of said heavily doped source/drain region, and into a top portion of said gate structure;

performing a first anneal procedure to form first metal silicide layers on the top surface of said heavily doped source/drain region, and to form a second metal silicide layer on the top surface of said gate structure, resulting in a salicide gate structure comprised of said second metal silicide layer, on underlying, said gate structure, leaving unreacted metal ions located on said insulator spacers;

selectively removing said unreacted metal ions; and performing a second anneal cycle to convert said first metal silicide layers, and said second metal silicide layer, to lower resistance, metal silicide layers.

2. The method of claim 1, wherein said gate insulator is a silicon dioxide layer, at a thickness between about 50 to 300 Angstroms, obtained via thermal oxidation procedures, performed in an oxygen-steam ambient at a temperature between about 800 to 1200° C.

3. The method of claim 1, wherein said gate structure is formed from a polysilicon layer, obtained via LPCVD procedures at a thickness between about 500 to 3500 Angstroms, and either in situ doped during deposition via the addition of arsine or phosphine to a silane ambient, or deposited intrinsically then doped via implantation of arsenic or phosphorous ions.

4. The method of claim 1, wherein said insulator spacers are comprised of silicon oxide, or silicon nitride, obtained via LPCVD or PECVD procedures, at a thickness between about 500 to 3000 Angstroms, then defined via an anisotropic RIE procedure using $CF_4$ or $CHF_3$ as an etchant.

5. The method of claim 1, wherein said heavily doped source/drain region is formed via ion implantation of arsenic or phosphorous ions, at an energy between about 30 to 70 KeV, at a dose between about $10^{14}$ to $10^{15}$ atoms/cm$^2$.

6. The method of claim 1, wherein said metal ions are chosen from a group consisting of titanium, tantalum, platinum, palladium, nickel, and cobalt, obtained via ion implantation procedures performed using an implant angle between about 0 to 20 degrees.

7. The method of claim 1, wherein said first metal silicide layers, located on said heavily doped source/drain region, are formed to a thickness between about 30 to 1000 Angstroms, via a rapid thermal anneal procedure, performed in a nitrogen ambient.

8. The method of claim 1, wherein said second metal silicide layer, located on said gate structure, is formed at a thickness between about 30 to 1000 Angstroms, via a rapid thermal anneal procedure, performed in a nitrogen ambient.

9. The method of claim 1, wherein said unreacted metal ions are selectively removed in a solution comprised of $H_2O_2$—$NH_4OH$—$H_2O$, at a temperature between about 60 to 100° C.

10. The method of claim 1, wherein said second anneal cycle, used to convert said first metal silicide layers, and said second metal silicide layer, to said lower resistance metal silicide layer, is performed using a rapid thermal anneal procedure, in a nitrogen ambient.

11. A method of forming a metal silicide layer, on a MOSFET source/drain region, and on a MOSFET gate structure, on a semiconductor substrate, featuring a blanket ion implantation procedure to supply the metal component of the metal silicide layers, anneal cycles to convert implanted metal ions to said metal silicide layer, and to selectively remove unreacted metal ions, comprising the steps of:

providing a polysilicon gate structure on an underlying silicon dioxide gate insulator layer, with insulator spacers located on the sides of said polysilicon gate structure, and with a heavily doped source/drain region located in a region of said semiconductor substrate not covered by said polysilicon gate structure, or by said insulator spacers;

performing said blanket ion implantation procedure, at an implant angle between about 0 to 20°, to place said metal ions into a top portion of said heavily doped source/drain region, into a top portion of said polysilicon gate structure, and into said insulator spacers;

performing a first rapid thermal anneal procedure to form first metal silicide layers on said heavily doped source/drain region, and to form a second metal silicide layer on said polysilicon gate structure, resulting in a salicide gate structure comprised of said second metal silicide layer on said polysilicon gate structure, while leaving said metal ions in said insulator spacers unreacted;

selectively removing said unreacted metal ions from said insulator layer, via use of a solution comprised of $H_2O_2$—$NH_4OH$—$H_2O$, at a temperature between about 60 to 100° C.; and performing a second rapid thermal anneal procedure to convert said first metal silicide layers and said second metal silicide layer, to lower resistance metal silicide layers.

12. The method of claim 11, wherein said silicon dioxide gate insulator layer is grown to a thickness between about 50 to 300 Angstrom, via thermal oxidation procedures, performed in an oxygen-steam ambient at a temperature between about 800 to 1200° C.

13. The method of claim 11, wherein said polysilicon gate structure is formed from a polysilicon layer, obtained via LPCVD procedures at a thickness between about 500 to 3500 Angstroms.

14. The method of claim 11, wherein said insulator spacers are comprised of silicon oxide, or silicon nitride, obtained via LPCVD or PECVD procedures, at a thickness between about 500 to 3000 Angstroms, then defined via an anisotropic RIE procedure using $CF_4$ or $CHF_3$ as an etchant.

15. The method of claim 11, wherein said heavily doped source/drain region is formed via ion implantation of arsenic or phosphorous ions, at an energy between about 30 to 70 KeV, and at a dose between about $10^{14}$ to $10^{15}$ atoms/cm$^2$.

16. The method of claim 11, wherein said metal ions are chosen from a group consisting of titanium, tantalum, platinum, palladium, nickel, and cobalt.

17. The method of claim 11, wherein said first rapid thermal anneal procedure, used to form said first metal silicide layers on said heavily doped source/drain region, and to form said second metal silicide layer on said polysilicon gate structure, is performed in a nitrogen ambient.

18. The method of claim 11, wherein said first metal silicide layers, and said second metal silicide layer, are formed to a thickness between about 30 to 70 Angstroms.

19. The method of claim 11, wherein said second rapid thermal anneal procedure, used to convert said first metal silicide layers, and said second metal silicide layer, to lower resistance metal silicide layers is performed in a nitrogen ambient.

* * * * *